US012603633B2

(12) United States Patent
    Tsukada

(10) Patent No.: US 12,603,633 B2
(45) Date of Patent: Apr. 14, 2026

(54) ACOUSTIC WAVE DEVICE, FILTER, AND MULTIPLEXER

(71) Applicant: TAIYO YUDEN CO., LTD., Tokyo (JP)

(72) Inventor: Mayu Tsukada, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 146 days.

(21) Appl. No.: 18/591,121

(22) Filed: Feb. 29, 2024

(65) Prior Publication Data

US 2024/0322784 A1     Sep. 26, 2024

(30) Foreign Application Priority Data

Mar. 22, 2023     (JP) ................................. 2023-045575

(51) Int. Cl.
    H03H 9/02       (2006.01)
    H03H 9/145      (2006.01)
    H03H 9/64       (2006.01)
(52) U.S. Cl.
    CPC ........ H03H 9/02637 (2013.01); H03H 9/145 (2013.01); H03H 9/6483 (2013.01)
(58) Field of Classification Search
    CPC .. H03H 9/02637; H03H 9/1457; H03H 9/145; H03H 9/6483
    See application file for complete search history.

(56) References Cited

U.S. PATENT DOCUMENTS

| | | | |
|---|---|---|---|
| 6,781,282 B1* | 8/2004 | Ikeura .................. | H03H 9/6459 |
| | | | 333/194 |
| 2006/0038637 A1* | 2/2006 | Kudo ................. | H03H 9/02921 |
| | | | 333/195 |
| 2012/0068790 A1* | 3/2012 | Yoshimoto ......... | H03H 9/02921 |
| | | | 333/195 |
| 2018/0013400 A1 | 1/2018 | Ito et al. ............ | H03H 9/14502 |
| 2019/0131955 A1* | 5/2019 | Kaneda ................ | H03H 9/6483 |

FOREIGN PATENT DOCUMENTS

JP          2018-007117 A     1/2018

* cited by examiner

*Primary Examiner* — Quan Tra
(74) *Attorney, Agent, or Firm* — Stein IP, LLC

(57) ABSTRACT

An acoustic wave device includes a piezoelectric body, a pair of comb-shaped electrodes provided on the piezoelectric body, the pair of comb-shaped electrodes including a plurality of electrode fingers, a reflector provided on the piezoelectric body so as to be arranged in line with the pair of comb-shaped electrodes in an arrangement direction of the electrode fingers, and an additional film provided on the piezoelectric body between the pair of comb-shaped electrodes and the reflector so that an overlap width with the pair of comb-shaped electrodes and an overlap width with the reflector are equal to or less than ⅛ of an average pitch of the electrode fingers of the pair of comb-shaped electrodes and a distance between the additional film and the pair of comb-shaped electrodes and a distance between the additional film and the reflector are equal to or less than ⅛ of the average pitch.

11 Claims, 15 Drawing Sheets

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2023-045575, filed on Mar. 22, 2023, the entire contents of which are incorporated herein by reference.

FIELD

A certain aspect of the present disclosure relates to an acoustic wave device, a filter, and a multiplexer.

BACKGROUND

In a high-frequency communication system typified by a cellular phone, a filter is used to remove unnecessary signals outside the frequency band used for communication. For example, an acoustic wave device including comb-shaped electrodes and reflectors is used as the filter. To reduce the size of the acoustic wave device, a configuration is known in which first dielectric films covering the reflectors are provided so as to have side surfaces in regions between the comb-shaped electrodes and the reflectors, and a second dielectric film that is in contact with the side surfaces of the first dielectric films and covers the comb-shaped electrodes as disclosed in, for example, Japanese Patent Application Laid-Open No. 2018-7117 (Patent Document 1).

SUMMARY

Spurious emissions may be generated due to leakage of the acoustic wave from the regions between the comb-shaped electrodes and the reflectors.

An object of the present disclosure is to reduce spurious emissions.

In one aspect of the present disclosure, there is provided an acoustic wave device including: a piezoelectric body; a pair of comb-shaped electrodes provided on the piezoelectric body, the pair of comb-shaped electrodes including a plurality of electrode fingers; a reflector provided on the piezoelectric body so as to be arranged in line with the pair of comb-shaped electrodes in an arrangement direction of the plurality of electrode fingers; and an additional film provided on the piezoelectric body between the pair of comb-shaped electrodes and the reflector so that an overlap width with the pair of comb-shaped electrodes and an overlap width with the reflector are equal to or less than ⅛ of an average pitch of the plurality of electrode fingers of the pair of comb-shaped electrodes and a distance between the additional film and the pair of comb-shaped electrodes and a distance between the additional film and the reflector are equal to or less than ⅛ of the average pitch.

In another aspect of the present disclosure, there is provided an acoustic wave device including: a piezoelectric body including a first section having a first thickness and a second section having a second thickness less than the first thickness; a pair of comb-shaped electrodes provided on the piezoelectric body in the first section, the pair of comb-shaped electrodes including a plurality of electrode fingers; and a reflector provided on the piezoelectric body in the first section, the reflector being provided in line with the pair of comb-shaped electrodes in an arrangement direction of the plurality of electrode fingers, the second section of the piezoelectric body being provided between the pair of comb-shaped electrodes and the reflector.

In another aspect of the present disclosure, there is provided an acoustic wave device including: a piezoelectric body; a pair of comb-shaped electrodes provided on the piezoelectric body, the pair of comb-shaped electrodes including a plurality of electrode fingers; and a reflector provided on the piezoelectric body and arranged in line with the pair of comb-shaped electrodes in an arrangement direction of the plurality of electrode fingers, an acoustic velocity of a lateral wave propagating through a region between the pair of comb-shaped electrodes and the reflector being equal to or greater than 0.95 times and equal to or less than 1.05 times an acoustic velocity of a lateral wave propagating through a region where the pair of comb-shaped electrodes are provided.

In another aspect of the present disclosure, there is provided a filter including the above acoustic wave device.

In another aspect of the present disclosure, there is provided a multiplexer including the above filter.

DETAILED DESCRIPTION

Hereinafter, embodiments of the present disclosure will be described with reference to the drawings.

First Embodiment

Figure 1A:
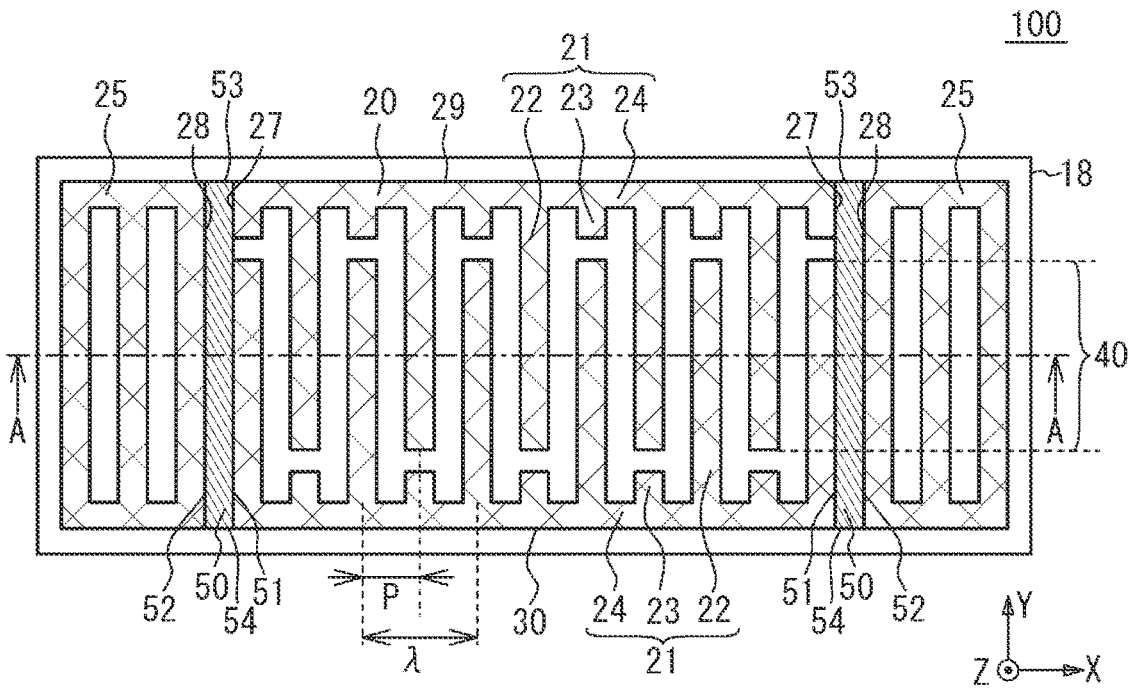
FIG. 1A is a plan view of an acoustic wave device in accordance with a first embodiment.
Figure 1B:
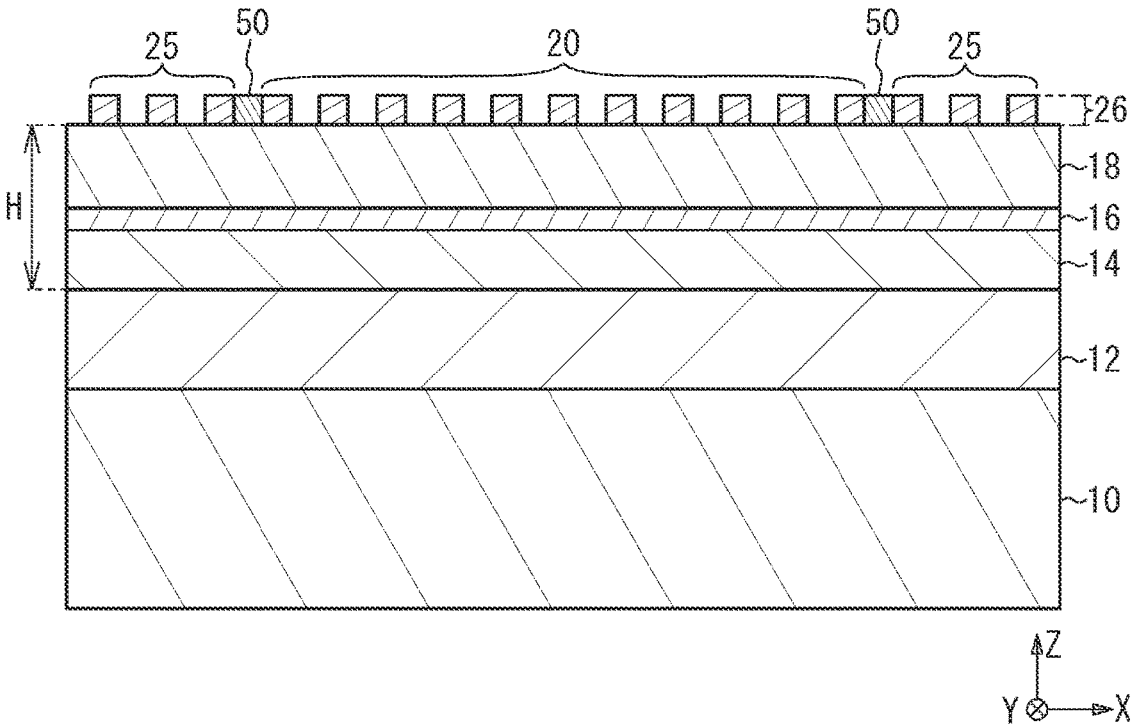
FIG. 1B is a cross-sectional view taken along line A-A in FIG. 1A.

FIG. 1A is a plan view of an acoustic wave device in accordance with a first embodiment, and FIG. 1B is a cross-sectional view taken along line A-A in FIG. 1A. In FIG. 1A, comb-shaped electrodes 21, reflectors 25, and additional films 50 are hatched for the sake of clarity of the drawing (the same applies to the following similar drawings). The arrangement direction of electrode fingers 22 is defined as an X direction, the longitudinal direction of the electrode fingers 22 is defined as a Y direction, and the thickness direction of a piezoelectric body 18 is defined as a Z direction. The X direction, the Y direction, and the Z direction do not necessarily correspond to the X-axis orientation and the Y-axis orientation of the crystal orientations of the piezoelectric body 18.

As illustrated in FIG. 1A and FIG. 1B, an acoustic wave device 100 in accordance with the first embodiment includes an insulating film 12 provided on a support substrate 10. A temperature compensation film 14 is provided on the insulating film 12. The piezoelectric body 18 is provided over the temperature compensation film 14 with a bonding layer 16 interposed between the piezoelectric body 18 and the temperature compensation film 14. An interdigital transducer (IDT) 20 and the reflectors 25 are provided on the piezoelectric body 18. The reflectors 25 are arranged in line with the IDT 20 in the X direction (the arrangement direction of the electrode fingers 22). The IDT 20 and the reflectors 25 are formed of a metal film 26 on the piezoelectric body 18.

The IDT 20 includes a pair of comb-shaped electrodes 21. Each comb-shaped electrode 21 includes a plurality of electrode fingers 22, a plurality of dummy electrode fingers 23, and a bus bar 24 to which the electrode fingers 22 and the dummy electrode fingers 23 are connected. The tips of the electrode fingers 22 of one of the comb-shaped electrodes 21 and the tips of the dummy electrode fingers 23 of the other of the comb-shaped electrodes 21 are opposed to each other. The dummy electrode fingers 23 may not be necessarily provided. The region where the electrode fingers 22 of the pair of comb-shaped electrodes 21 overlap is an overlap region 40. The length of the overlap region 40 in the Y direction is an aperture length. The pair of comb-shaped electrodes 21 are opposed to each other so that the electrode fingers 22 of one of the comb-shaped electrodes 21 and the electrode fingers 22 of the other of the comb-shaped electrodes 21 are substantially alternately arranged in at least a part of the overlap region 40. The acoustic wave (surface acoustic wave) in the main mode excited by the electrode fingers 22 in the overlap region 40 propagates mainly in the X direction. The pitch of the electrode fingers 22 of one of the comb-shaped electrodes 21 is substantially equal to the wavelength λ of the surface acoustic wave. The pitch of the electrode fingers 22 of one of the comb-shaped electrodes 21 is substantially two times the pitch P of the electrode fingers 22 of the pair of comb-shaped electrodes 21. The reflectors 25 reflect the surface acoustic wave excited by the electrode fingers 22. Thus, the surface acoustic wave is confined in the overlap region 40.

The additional film 50 is provided on the piezoelectric body 18 between the IDT 20 and each of the reflectors 25. The additional film 50 is provided to cover, for example, the entire region between the IDT 20 and the reflector 25. One side surface 51 of the two side surfaces of the additional film 50 along the Y direction is in contact with, for example, a side surface 27 of the pair of comb-shaped electrodes 21 closest to the reflector 25, and the other side surface 52 is in contact with, for example, a side surface 28 of the reflector 25 closest to the pair of comb-shaped electrodes 21. One side surface 53 of the two side surfaces of the additional film 50 along the X direction is substantially flush with an outer side surface 29 of the bus bar 24 of one of the pair of comb-shaped electrodes 21, for example, and the other side surface 54 is substantially flush with an outer side surface 30 of the bus bar 24 of the other of the pair of comb-shaped electrodes 21, for example.

The support substrate 10 is, for example, a sapphire substrate, a spinel substrate, a silicon substrate, a crystal substrate, a quartz substrate, or an alumina substrate. The insulating film 12 is a film in which the acoustic velocity of the acoustic wave propagating therethrough is higher than the acoustic velocities of the acoustic waves propagating through the piezoelectric body 18 and the temperature compensation film 14. For example, the acoustic velocity of the bulk wave propagating through the insulating film 12 is higher than the acoustic velocities of the bulk waves propagating through the piezoelectric body 18 and the temperature compensation film 14. The insulating film 12 is, for example, a polycrystalline or amorphous insulating film, and is, for example, an aluminum oxide film, a silicon film, an aluminum nitride film, a silicon nitride film, or a silicon carbide film. A plurality of layers made of different materials may be provided as the insulating film 12.

The temperature compensation film 14 has a temperature coefficient of an elastic constant opposite in sign to the temperature coefficient of the elastic constant of the piezoelectric body 18. For example, the temperature coefficient of the elastic constant of the piezoelectric body 18 is negative, and the temperature coefficient of the elastic constant of the temperature compensation film 14 is positive. The temperature compensation film 14 is, for example, a silicon oxide film to which elements other than oxygen (O) and silicon (Si) are not intentionally added, or a silicon oxide film to which another element, for example, at least one of the following elements: fluorine (F), boron (B), chlorine (CI), nitrogen (N), phosphorus (P), and sulfur (S) is intentionally added. The acoustic velocity of the acoustic wave propagating through the temperature compensation film 14 is lower than the acoustic velocity of the acoustic wave propagating through the piezoelectric body 18. For example, the acoustic velocity of the bulk wave propagating through the temperature compensation film 14 is lower than the acoustic velocity of the bulk wave propagating through the piezoelectric body 18. The magnitude of the acoustic velocity (phase velocity) of the surface acoustic wave is the same as the magnitude of the acoustic velocity of the bulk wave.

The bonding layer 16 is a layer for bonding the temperature compensation film 14 and the piezoelectric body 18. For example, the bonding layer 16 is a layer in which the acoustic velocity of the acoustic wave propagating therethrough is higher than that in the temperature compensation film 14. The bonding layer 16 is, for example, polycrystalline or amorphous, and is, for example, an aluminum oxide layer, a silicon layer, an aluminum nitride layer, a silicon nitride layer, or a silicon carbide layer. The bonding layer 16 is sufficiently thin compared to the piezoelectric body 18 and the temperature compensation film 14.

The piezoelectric body 18 is, for example, a monocrystalline lithium tantalate ($LiTaO_3$) film or a monocrystalline lithium niobate ($LiNbO_3$) film, and is, for example, a rotated Y-cut X-propagation lithium tantalate film or a rotated Y-cut X-propagation lithium niobate film.

The metal film 26 is a film containing, for example, aluminum (Al), copper (Cu), molybdenum (Mo), iridium (Ir), platinum (Pt), rhenium (Re), rhodium (Rh), ruthenium (Ru), tantalum (Ta), or tungsten (W) as a main component. An adhesion film such as a titanium (Ti) film or a chromium (Cr) film may be provided between the metal film 26 and the piezoelectric body 18. An insulating film may be provided so as to cover the electrode fingers 22 and the dummy electrode fingers 23. In this case, the additional film 50 may be provided on the insulating film. The insulating film may function as a protective film.

The additional film 50 is a film containing, for example, tantalum oxide ($Ta_2O_5$), niobium oxide ($Nb_2O_5$), silicon oxide ($SiO_2$), or aluminum oxide ($Al_2O_3$) as a main component. When a film contains a certain element as its main component, the film may contain intentional or unintentional impurities other than the main component. When a certain element is a main component in a certain film, the concentration of the certain element is, for example, 50 atomic % or greater, or for example, 80 atomic % or greater. In the case that the main components are two elements, such as silicon oxide or the like, the total of the concentration of silicon and the concentration of oxygen is, for example, 50 atomic % or greater, or for example, 80 atomic % or greater, and the concentration of silicon and the concentration of oxygen are each, for example, 10 atomic % or greater.

The surface acoustic wave excited by the electrode fingers 22 propagates through the section from the surface of the piezoelectric body 18 to a depth of 2.0λ. Therefore, in order for the temperature compensation film 14 to exhibit the temperature compensation function, the distance H between the upper surface of the piezoelectric body 18 and the lower surface of the temperature compensation film 14 is preferably equal to or less than 4.0 times the average pitch P of the electrode fingers 22 (equal to or less than 2.0λ), more preferably equal to or less than 3.0 times the average pitch P of the electrode fingers 22 (equal to or less than 1.5λ). The thickness of the piezoelectric body 18 is preferably equal to or less than 2.0 times the average pitch P of the electrode fingers 22 (equal to or less than 2λ), and more preferably equal to or less than 1.6 times the average pitch P of the electrode fingers 22 (equal to or less than 0.8λ). If the piezoelectric body 18 is too thin, the acoustic wave is not excited. Therefore, the thickness of the piezoelectric body 18 is preferably equal to or greater than 0.2 times the average pitch P of the electrode fingers 22 (equal to or greater than 0.1λ). The average pitch P of the electrode fingers 22 may be calculated by dividing the length of the IDT 20 in the X direction by the number of the electrode fingers 22.

Manufacturing Method

Figure 2A:
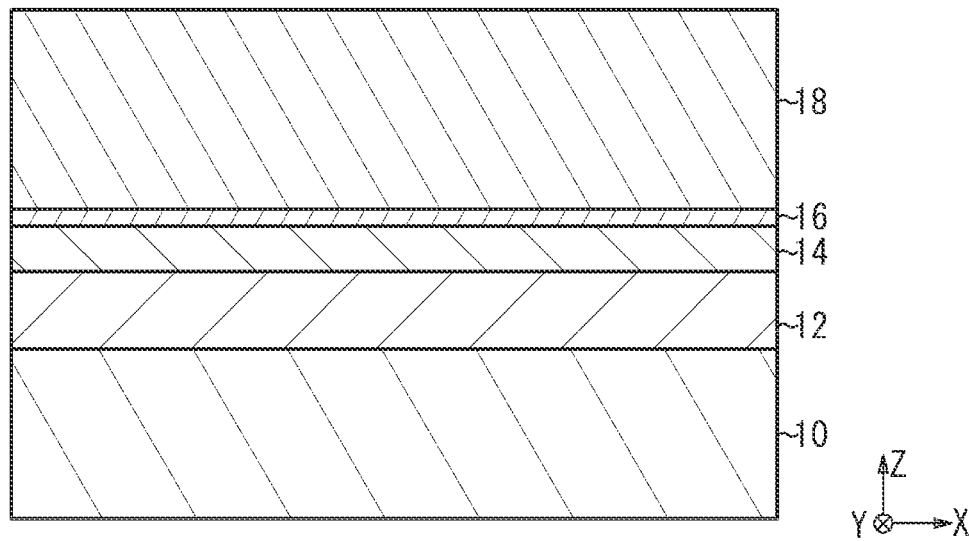
FIG. 2A to FIG. 2C are cross-sectional views illustrating a method of manufacturing the acoustic wave device in accordance with the first embodiment.
Figure 2B:
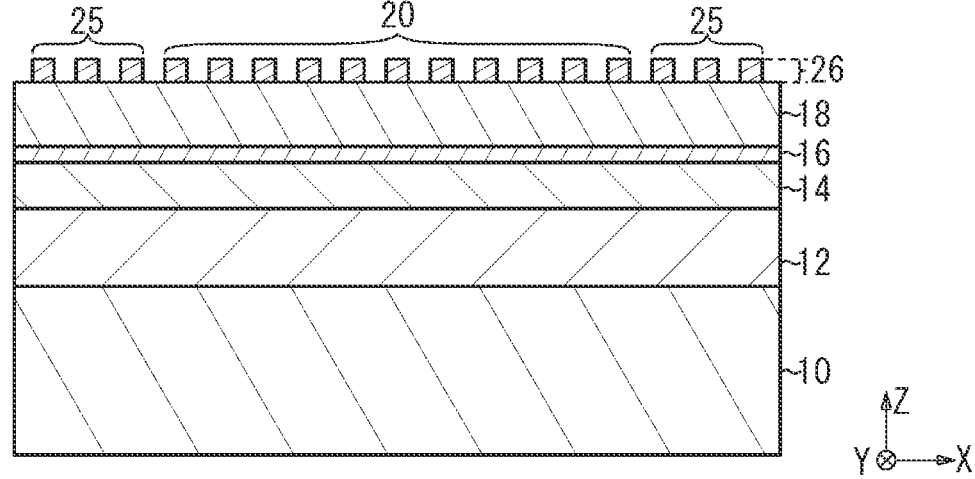
Figure 2C:
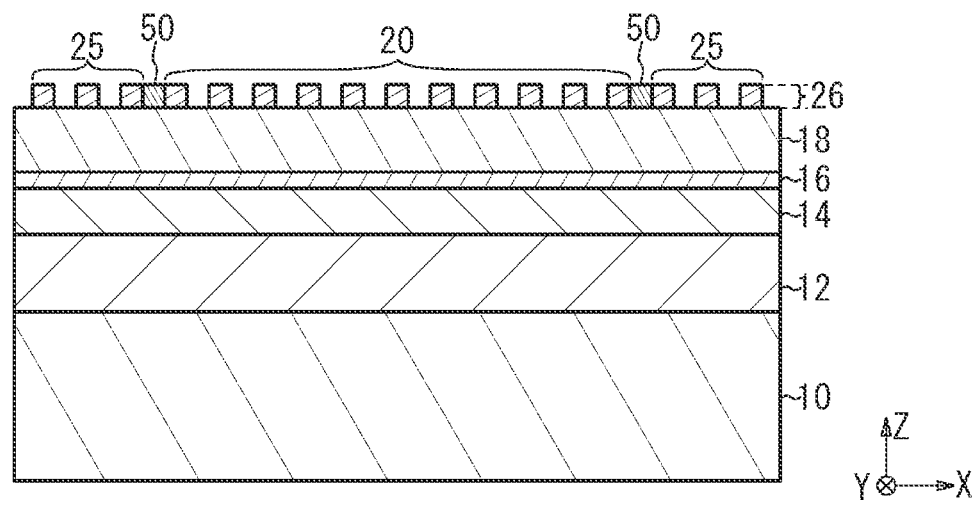

FIG. 2A to FIG. 2C are cross-sectional views illustrating a method for manufacturing the acoustic wave device in accordance with the first embodiment. As illustrated in FIG. 2A, the support substrate 10 having a flat upper surface is prepared. The arithmetic mean roughness Ra of the upper surface of the support substrate 10 is, for example, 1 nm or less. The insulating film 12 is formed on the support substrate 10 by, for example, chemical vapor deposition (CVD), sputtering, or vapor deposition. The temperature compensation film 14 is formed on the insulating film 12 by, for example, CVD, sputtering, or vapor deposition. The piezoelectric body 18 is bonded on the temperature compensation film 14 through the bonding layer 16. The temperature compensation film 14 and the piezoelectric body 18 may be directly bonded without the bonding layer 16. For example, a surface activation method is used for the bonding. The piezoelectric body 18 here is a film (substrate) thicker than the piezoelectric body 18 in FIG. 1B.

As illustrated in FIG. 2B, the upper surface of the piezoelectric body 18 is polished to the desired thickness by, for example, chemical mechanical polishing (CMP). Thereafter, the IDT 20 and the reflectors 25 made of the metal film 26 are formed on the piezoelectric body 18 by, for example, photolithography and etching.

As illustrated in FIG. 2C, the additional films 50 are formed between the IDT 20 and the reflectors 25 using, for example, lift-off. Through the above process, the acoustic wave device in accordance with the first embodiment is obtained.

COMPARATIVE EXAMPLE

Figure 3A:
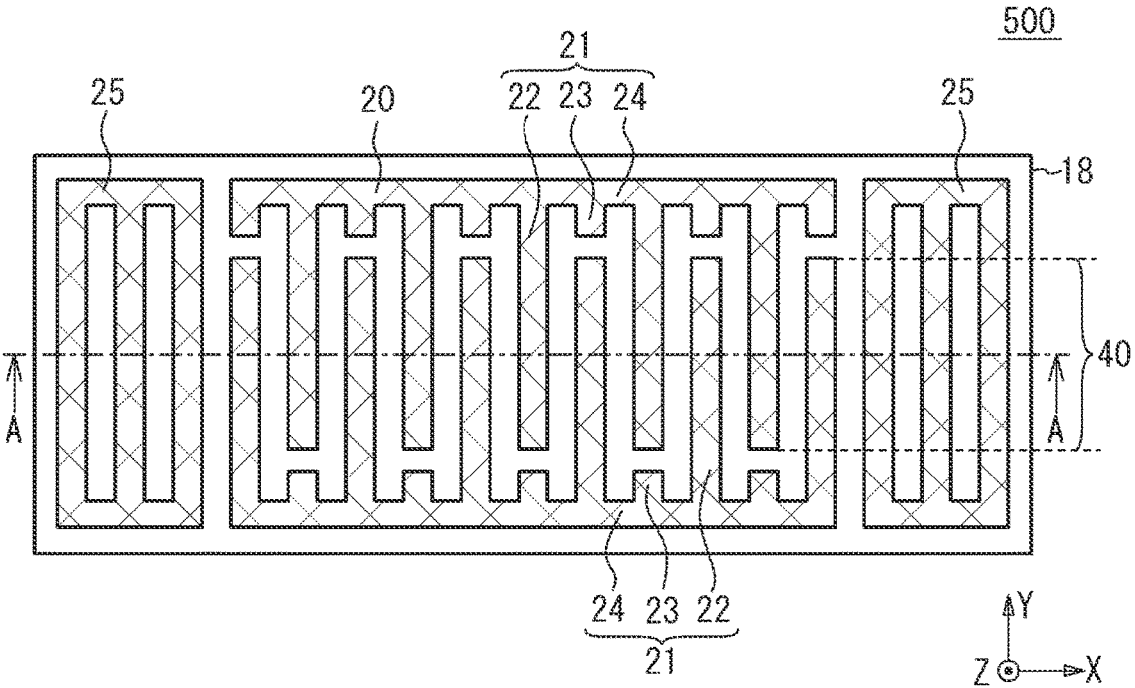
FIG. 3A is a plan view of an acoustic wave device in accordance with a comparative example.
Figure 3B:
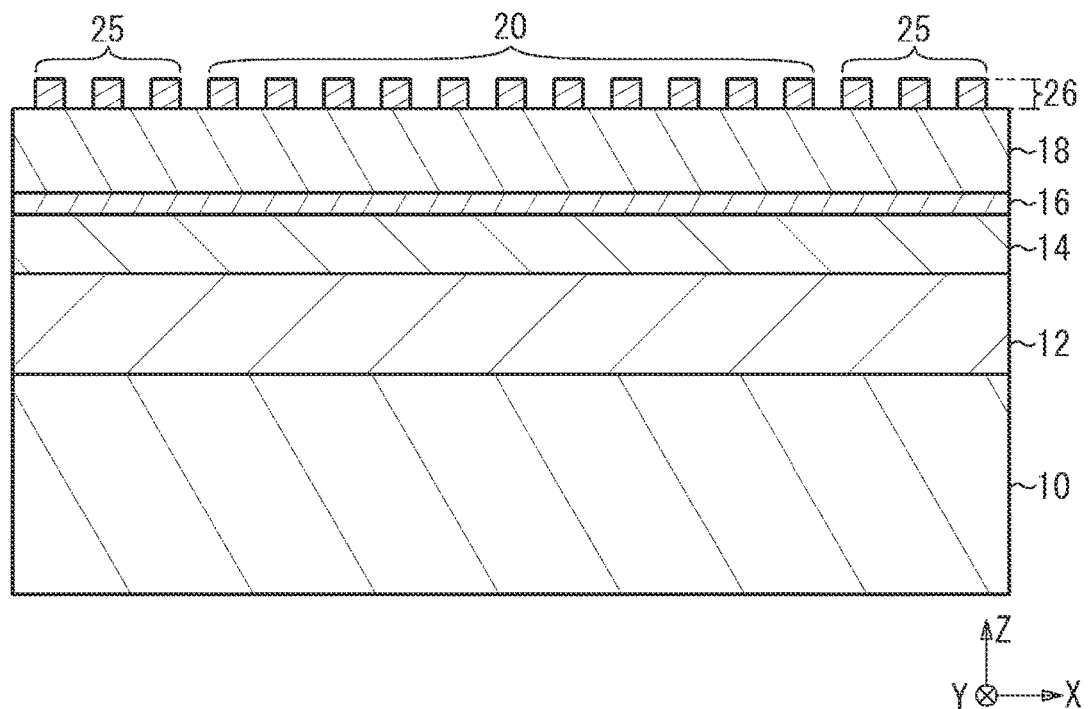
FIG. 3B is a cross-sectional view taken along line A-A in FIG. 3A.

FIG. 3A is a plan view of an acoustic wave device in accordance with a comparative example, and FIG. 3B is a cross-sectional view taken along line A-A in FIG. 3A. As illustrated in FIG. 3A and FIG. 3B, in an acoustic wave device 500 of the comparative example, no additional film is provided between the IDT 20 and the reflectors 25. Other configurations are the same as those of the first embodiment, and thus the description thereof will be omitted.

Figures 4A, 4B:
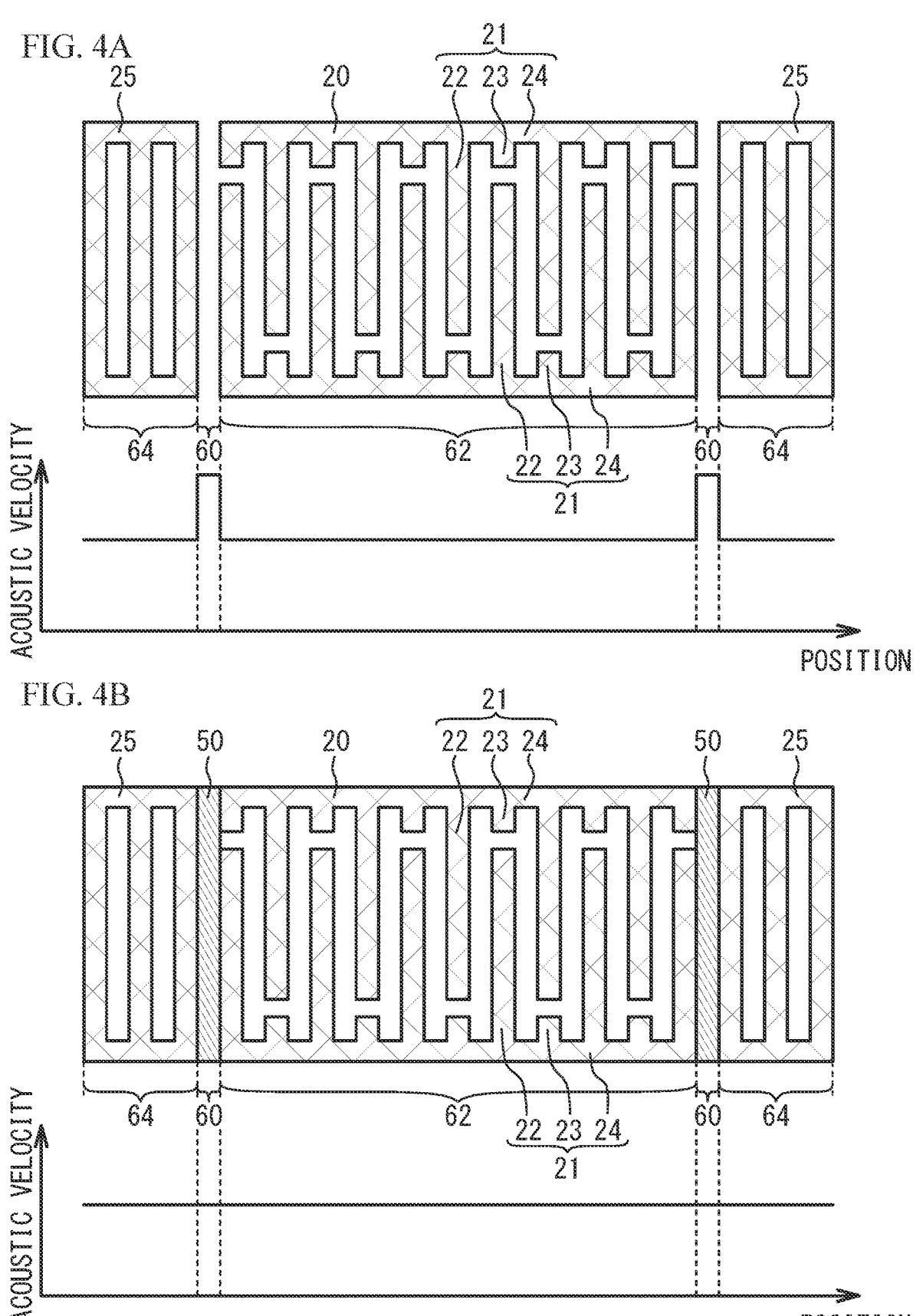
FIG. 4A is a diagram illustrating the acoustic velocity of a lateral wave in the comparative example.
FIG. 4B is a diagram illustrating the acoustic velocity of the lateral wave in the first embodiment.

FIG. 4A is a diagram illustrating the acoustic velocity of the lateral wave in the comparative example, and FIG. 4B is a diagram illustrating the acoustic velocity of the lateral wave in the first embodiment. The acoustic velocity of the lateral wave is substantially equal to the acoustic velocity of the surface acoustic wave excited by the electrode fingers 22. As illustrated in FIG. 4A, in the comparative example, no additional film is provided between the IDT 20 and the reflectors 25. Therefore, the acoustic velocity of the lateral wave propagating through regions 60 between the IDT 20 and the reflectors 25 is higher than the acoustic velocity of the lateral wave propagating through a region 62 where the comb-shaped electrodes 21 are provided and regions 64 where the reflectors 25 are provided. It is considered that the regions 64 and 62 have metal electrodes therein, and thus the acoustic velocity in the regions 64 and 62 is lower than that in the region 60 where no metal electrodes are present and the acoustic velocity propagating therethrough is equal to that of the surface of the piezoelectric body 18.

Figure 5A:
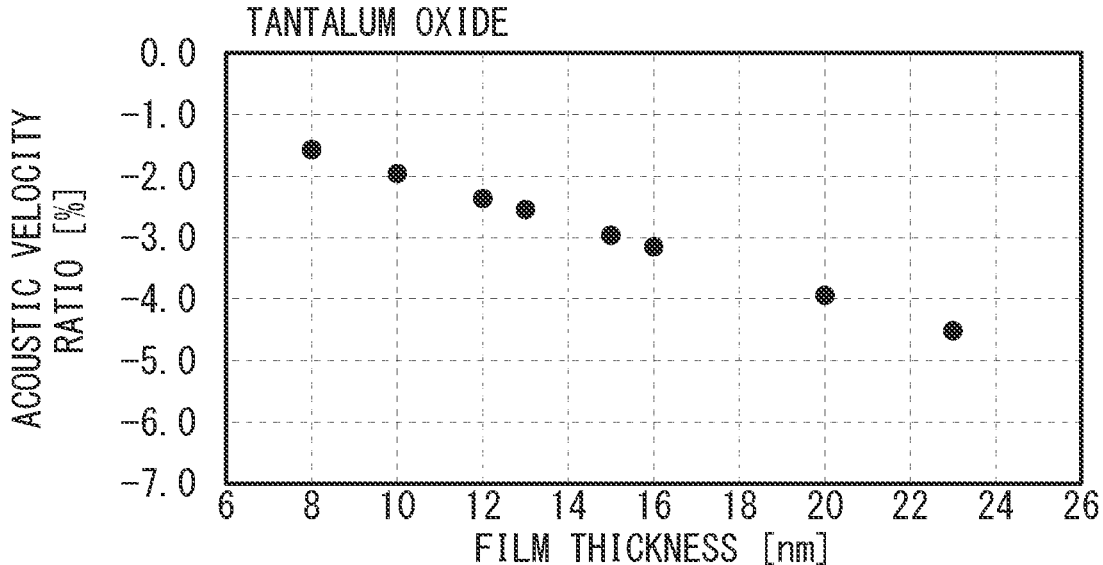
FIG. 5A and FIG. 5B present the results of simulations of the relationship between the thickness of an additional film and the amount of decrease in the acoustic velocity of the lateral wave.
Figure 5B:
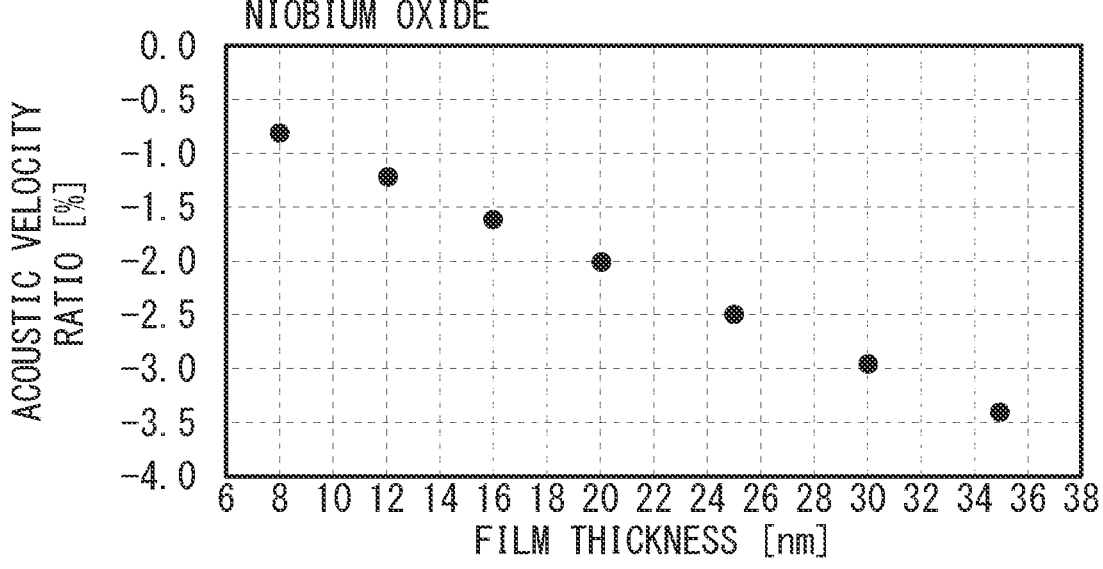

On the other hand, as illustrated in FIG. 4B, in the first embodiment, the additional films 50 are provided between the IDT 20 and the reflectors 25. The acoustic velocity of the lateral wave can be changed by the weight of the film provided on the piezoelectric body 18. FIG. 5A and FIG. 5B present the results of simulations of the relationship between the thickness of the additional films 50 and the amount of decrease in the acoustic velocity of the lateral wave when a tantalum oxide film or a niobium oxide film is used as the additional film 50. In FIG. 5A and FIG. 5B, the horizontal axis represents the film thickness of the additional film 50 (tantalum oxide film or niobium oxide film). The vertical axis represents the acoustic velocity ratio (%) of the acoustic velocity of the lateral wave propagating through the region 60 with respect to the case where the additional film 50 is not provided (0%). As presented in FIG. 5A and FIG. 5B, as the additional film 50 thickens, the acoustic velocity of the lateral wave propagating through the region 60 decreases.

Therefore, in the first embodiment, by providing the additional film 50 between the IDT 20 and the reflectors 25, the acoustic velocity of the lateral wave propagating through the region 60 is reduced, and the acoustic velocity of the lateral wave propagating through the region 60 can be adjusted to be substantially equal to the acoustic velocity of the lateral wave propagating through each of the regions 62 and 64. In other words, the additional films 50 are provided between the IDT 20 and the reflectors 25 so that the acoustic velocity of the lateral wave propagating through the region 60 is substantially the same as the acoustic velocity of the lateral wave propagating through each of the regions 62 and 64.

The acoustic velocity of the lateral wave propagating through the region 60 and the acoustic velocity of the lateral wave propagating through each of the regions 62 and 64 are substantially the same when the weight of the film in the region 60 is substantially equal to the weight of the film in each of the regions 62 and 64. Since the additional film 50 is provided in the region 60, the film weight in the region 60 can be defined by (H1×ρ1), where H1 is the thickness of the additional film 50 and ρ is the density of the additional film 50. On the other hand, the weight of the film in each of the regions 62 and 64 is affected by the duty ratio of the electrode finger 22, and therefore, can be defined by (H2×D×ρ2), where H2 is the thickness of the electrode finger 22, D is the duty ratio, and ρ2 is the density. Therefore, when (H1×ρ1)=(H2×D×ρ2) is satisfied, the acoustic velocity of the lateral wave propagating through the region 60 is the same as the acoustic velocity of the lateral wave propagating through each of the regions 62 and 64. In the first embodiment, the additional film 50 is formed of an appropriate material and with an appropriate film thickness so that the value of (H1×ρ1) is equal to or greater than 0.4 times and equal to or less than 1.6 times the value of (H2×D×ρ2) and the acoustic velocity of the lateral wave propagating through the region 60 is substantially the same as the acoustic velocity of the lateral wave propagating through each of the regions 62 and 64.

For example, it is assumed that the finger electrodes 22 are formed of an aluminum film having a thickness of 150 nm, the duty ratio is 50%, and the additional film 50 is a tantalum oxide film or a niobium oxide film. Since the density of aluminum is 2700 kg/cm³, and the density of tantalum oxide is 8100 kg/cm³, (H1×ρ1)=8100×H1 and (H2×D×ρ2)=150×0.5×2700=202500. Therefore, when the additional film 50 is a tantalum oxide film, the acoustic velocity of the lateral wave propagating through the region 60 is substantially the same as the acoustic velocity of the lateral wave propagating through each of the regions 62 and 64 by setting the thickness H1 to 10.0 nm to 40.0 nm. Since the density of niobium oxide is 4470 kg/cm³, (H1×ρ1)=4470×H1. Therefore, when the additional film 50 is a niobium oxide film, the acoustic velocity of the lateral wave propagating through the region 60 is substantially the same as the acoustic velocity of the lateral wave propagating through each of the regions 62 and 64 by setting the thickness H1 to 18.1 nm to 72.5 nm.

Simulation

Figure 6A:
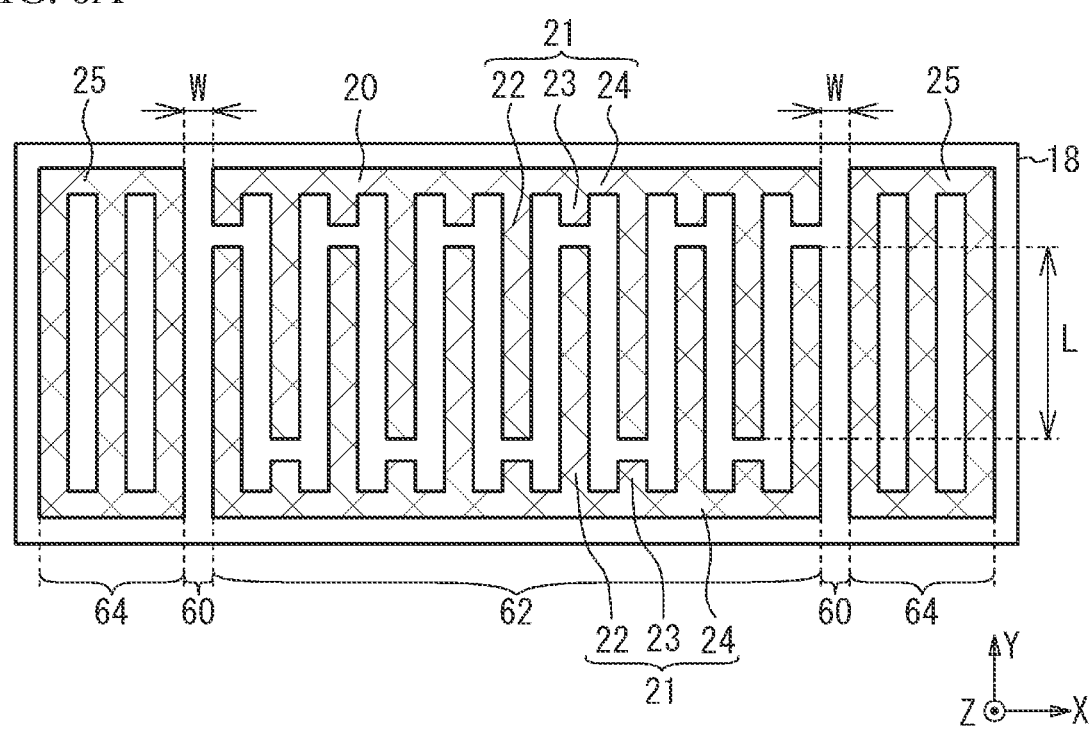
FIG. 6A is a plan view of a simulated model.
Figure 6B:
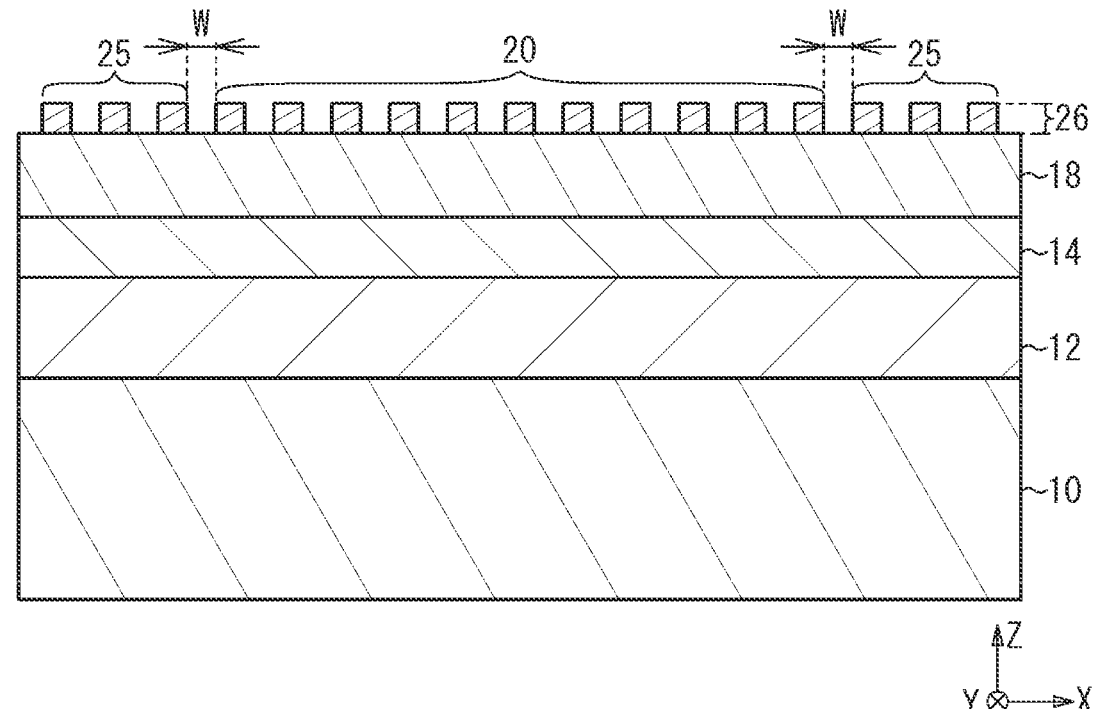
FIG. 6B is a cross-sectional view thereof.

Simulations for evaluating spurious emissions were performed on models 1, 2, and 3 in which the acoustic velocity of the lateral wave propagating through the region 60 between the IDT 20 and the reflector 25 was varied. FIG. 6A is a plan view of the simulated models 1, 2, and 3, and FIG. 6B is a cross-sectional view of the models. The simulation conditions are described below with reference to FIG. 6A and FIG. 6B.

Common conditions

Wavelength λ of acoustic wave: 2.2 μm

Support substrate 10: Sapphire substrate

Insulating film 12: Aluminum oxide film with a thickness of 6000 nm

Temperature compensation film 14: Silicon oxide film with a thickness of 440 nm

Piezoelectric body 18: Lithium tantalate film with a thickness of 660 nm

IDT 20, reflectors 25: Multilayer film including a titanium film with a thickness of 10 nm and an aluminum film of 135 nm Number of pairs in IDT 20: 150 pairs Number of pairs of in each reflector 25: 20

Duty ratio of electrode finger 22: 50%

Length of dummy electrode finger 23 in Y direction: 1.5λ

Aperture length L: 152

Distance W between IDT 20 and reflector 25: λ/4

Conditions of Model 1

Acoustic velocity of lateral wave in each of regions 62 and 64: 3750 m/s

Acoustic velocity of lateral wave in region 60: 4200 m/s

Conditions of Model 2

Acoustic velocity of lateral wave in each of regions 62 and 64: 3750 m/s

Acoustic velocity of lateral wave in region 60: 3570 m/s

Conditions of Model 3

Acoustic velocity of lateral wave in each of regions 62 and 64: 3750 m/s

Acoustic velocity of lateral wave in region 60: 2940 m/s

Figure 7A:
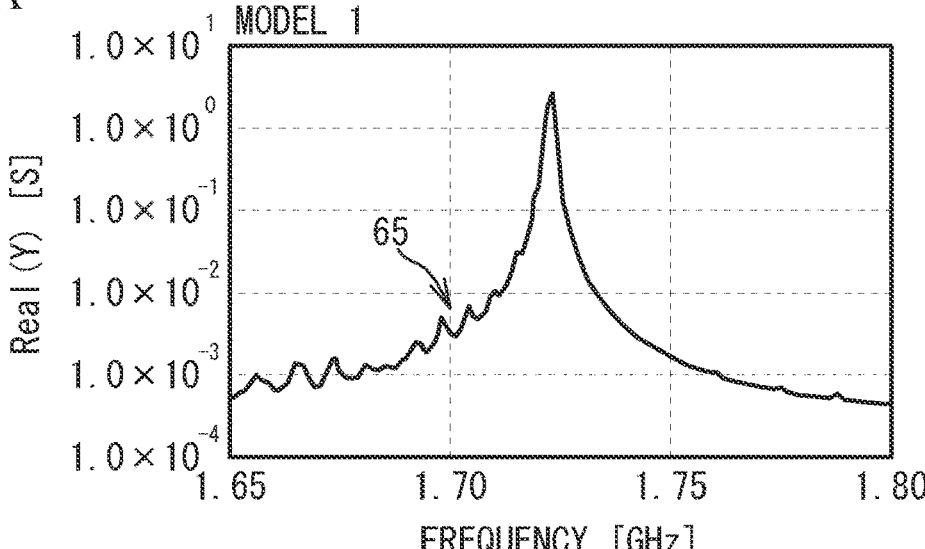
FIG. 7A to FIG. 7C present simulation results of a real part Real(Y) of admittance with respect to frequency.
Figure 7B:
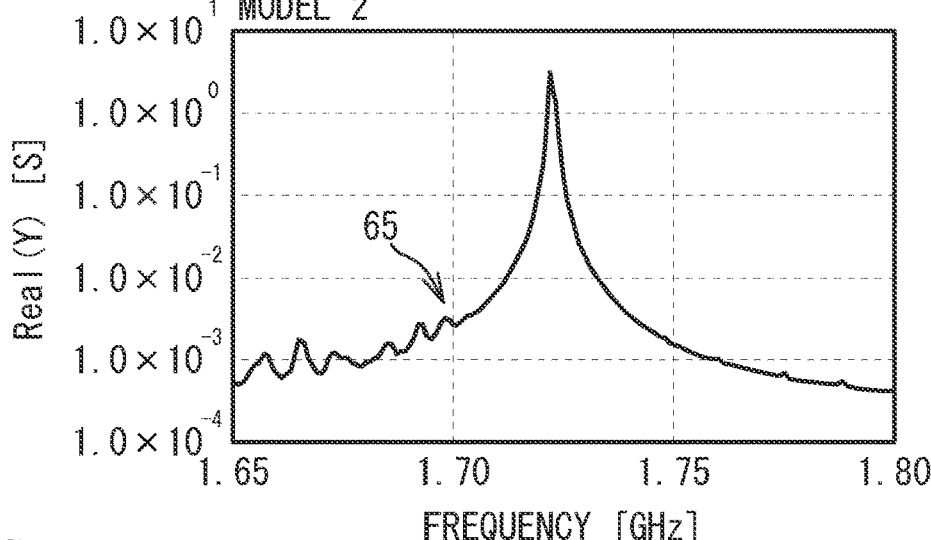
Figure 7C:
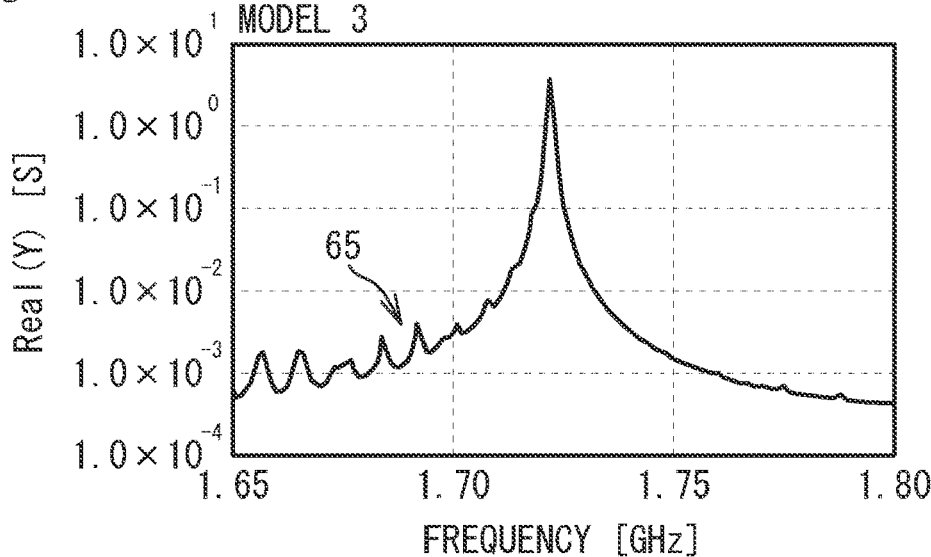

FIG. 7A to FIG. 7C are simulation results of the real part Real(Y) of the admittance with respect to the frequency for the models 1, 2, and 3, respectively. In FIG. 7A to FIG. 7C, the horizontal axis represents the frequency [GHz], and the vertical axis represents the real part Real(Y) [S] of the admittance. As presented in FIG. 7A to FIG. 7C, large spurious emissions 65 were observed in the models 1 and 3. On the other hand, the spurious emission 65 of the model 2 is smaller than those of the models 1 and 3. In the models 1 and 3, as described in the simulation conditions, the difference between the acoustic velocity of the lateral wave in each of the regions 62 and 64 and the acoustic velocity of the lateral wave in the region 60 is large. Therefore, it is considered that spurious emissions in the longitudinal mode are generated due to the discontinuity between the acoustic velocity in each of the regions 62 and 64 and the acoustic velocity in the region 60, and thus the spurious emission 65 is increased. On the other hand, in the model 2, as described in the simulation conditions, the difference between the acoustic velocity of the lateral wave in each of the regions 62 and 64 and the acoustic velocity of the lateral wave in the region 60 is small. Therefore, it is considered that the spurious emission 65 was reduced because the longitudinal-mode spurious emission was suppressed. The Q factors of the models 2 and 3 are improved as compared with that of the model 1.

The simulation results reveal that spurious emissions can be reduced by reducing the difference between the acoustic velocity of the lateral wave propagating through the region 60 and the acoustic velocity of the lateral wave propagating through each of the regions 62 and 64. Therefore, as illustrated in FIG. 4A, in the comparative example, the difference between the acoustic velocity of the lateral wave propagating through the region 60 and the acoustic velocity of the lateral wave propagating through each of the regions 62 and 64 is large, and thus a large spurious emission is generated. On the other hand, as illustrated in FIG. 4B, in the first embodiment, the additional film 50 is provided between the IDT 20 and each of the reflectors 25, and thus the difference between the acoustic velocity of the lateral wave propagating through the region 60 and the acoustic velocity of the lateral wave propagating through each of the regions 62 and 64 is reduced, and thus spurious emissions are reduced.

In the model 2, the acoustic velocity of the lateral wave in the region 60 is 0.952 times the acoustic velocity of the lateral wave in each of the regions 62 and 64. Therefore, in the first embodiment, in order to reduce the spurious emission 65, the acoustic velocity of the lateral wave propagating through the region 60 is adjusted to be equal to or greater than 0.95 times and equal to or less than 1.05 times the acoustic velocity of the lateral wave propagating through each of the regions 62 and 64. Based on the assumption that the acoustic velocity of 4200 m/s of the lateral wave in the region 60 of the model 1 is obtained when the additional film 50 is not provided, the spurious emission 65 can be reduced by adjusting the value of (H1×ρ1) to be equal to or greater than 0.4 times and equal to or less than 1.6 times the value of (H2×D×ρ2).

Variations of First Embodiment

Figure 8A:
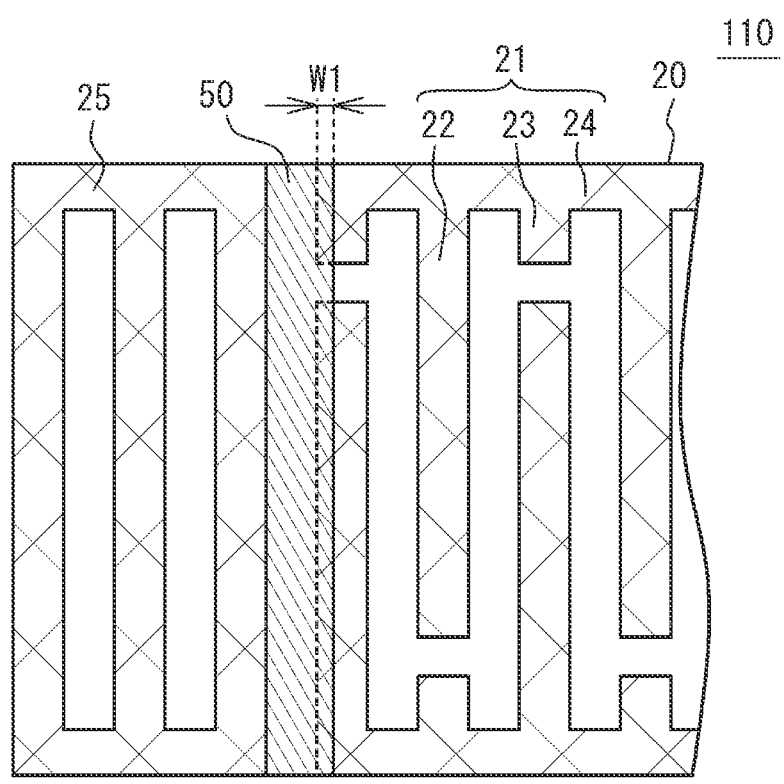
FIG. 8A is a plan view of an acoustic wave device in accordance with a first variation of the first embodiment.
Figure 8B:
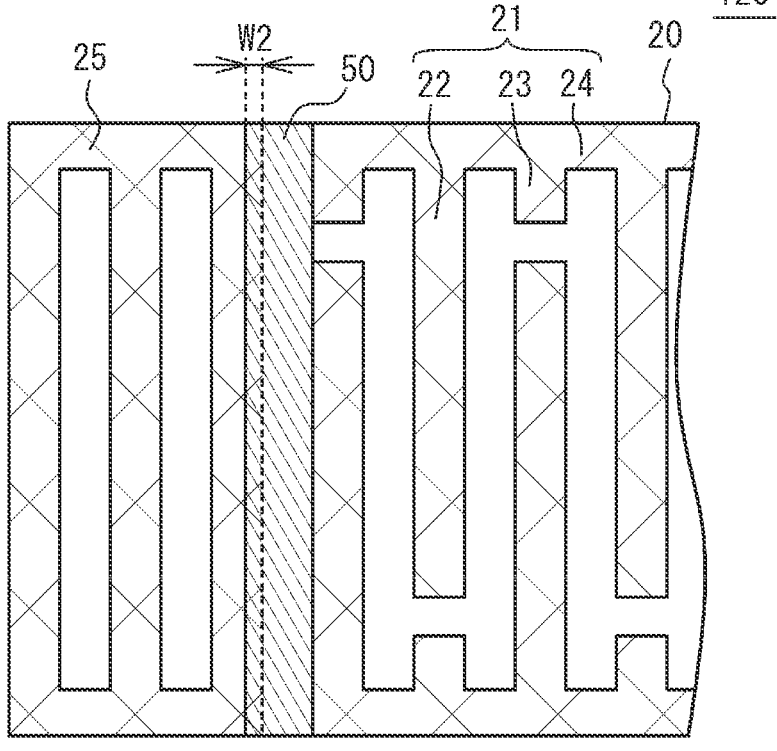
FIG. 8B is a plan view of an acoustic wave device in accordance with a second variation of the first embodiment.
Figure 9A:
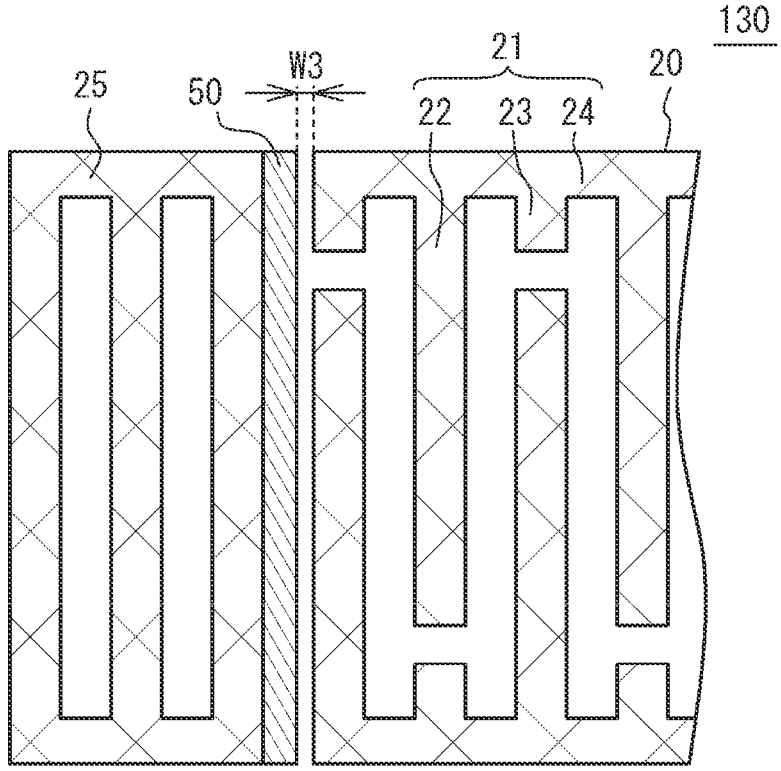
FIG. 9A is a plan view of an acoustic wave device in accordance with a third variation of the first embodiment.
Figure 9B:
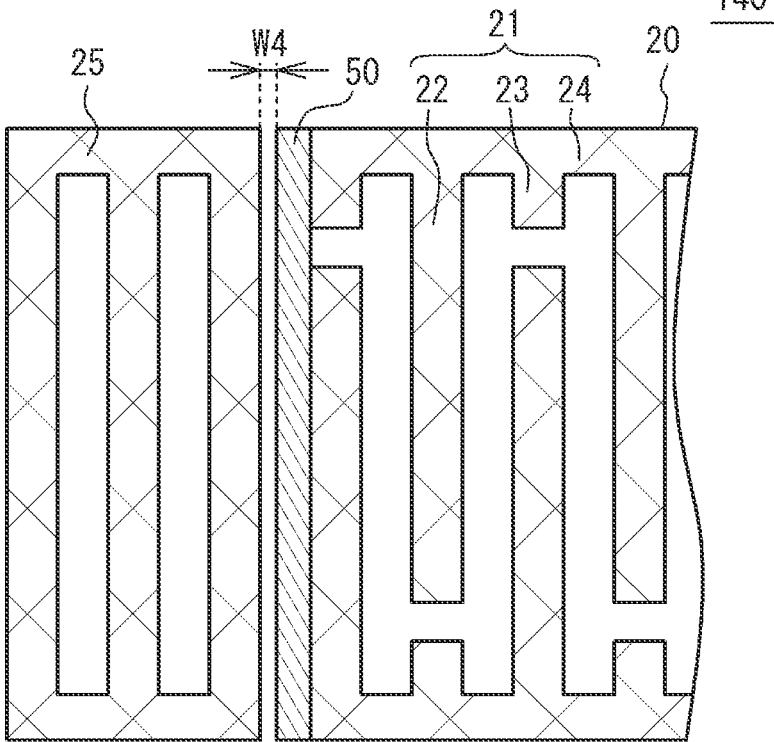
FIG. 9B is a plan view of an acoustic wave device in accordance with a fourth variation of the first embodiment.

FIG. 8A is a plan view of an acoustic wave device in accordance with a first variation of the first embodiment, and FIG. 8B is a plan view of an acoustic wave device in accordance with a second variation of the first embodiment. FIG. 9A is a plan view of an acoustic wave device in accordance with a third variation of the first embodiment, and FIG. 9B is a plan view of an acoustic wave device in accordance with a fourth variation of the first embodiment. FIG. 8A to FIG. 9B illustrate a part of the acoustic wave device.

As illustrated in FIG. 8A, in an acoustic wave device 110 in accordance with the first variation of the first embodiment, the additional film 50 is provided to overlap the comb-shaped electrodes 21. Other configurations are the same as those of the first embodiment, and thus the description thereof will be omitted. Since the comb-shaped electrodes 21 are designed to obtain optimum characteristics, when the additional film 50 overlaps the comb-shaped electrodes 21, the acoustic velocity of the lateral wave changes, and a spurious emission may be generated. Therefore, to reduce spurious emissions, it is preferable that the additional film 50 does not overlap the comb-shaped electrodes 21 as in the first embodiment, but the overlap width W1 is adjusted to be equal to or less than λ/16 when the additional film 50 overlaps the comb-shaped electrodes 21 as in the first variation of the first embodiment.

As illustrated in FIG. 8B, in an acoustic wave device 120 in accordance with the second variation of the first embodiment, the additional film 50 is provided to overlap the reflector 25. Other configurations are the same as those of the first embodiment, and thus the description thereof will be omitted. Since the reflector 25 is also designed to have optimum characteristics, the acoustic velocity of the lateral wave may change and a spurious emission may be generated when the additional film 50 overlaps the reflector 25. Therefore, to reduce spurious emissions, it is preferable that the additional film 50 does not overlap the reflector 25 as in the first embodiment, but the overlap width W2 is adjusted to be equal to or less than λ/16 when the additional film 50 overlaps the reflector 25 as in the second variation of the first embodiment.

As illustrated in FIG. 9A, in an acoustic wave device 130 in accordance with the third variation of the first embodiment, the additional film 50 is provided away from the comb-shaped electrodes 21. Other configurations are the same as those of the first embodiment, and thus the description thereof will be omitted. If there is a region where the additional film 50 is not provided in the region between the comb-shaped electrodes 21 and the reflector 25, the acoustic velocity of the lateral wave in this region increases, and a spurious emission may be generated. Therefore, it is preferable that the additional film 50 is not separated from the comb-shaped electrodes 21 as in the first embodiment, but the distance W3 between the additional film 50 and the comb-shaped electrodes 21 is adjusted to be equal to or less than λ/16 when the additional film 50 is separated from the comb-shaped electrodes 21 as in the third variation of the first embodiment.

As illustrated in FIG. 9B, in an acoustic wave device 140 in accordance with the fourth variation of the first embodiment, the additional film 50 is provided away from the reflector 25. Other configurations are the same as those of the first embodiment, and thus the description thereof will be omitted. As described above, in the region between the comb-shaped electrodes 21 and the reflector 25 where the additional film 50 is not provided, the acoustic velocity of the lateral wave is increased, and a spurious emission may be generated. Therefore, it is preferable that the additional film 50 is not separated from the reflector 25 as in the first embodiment, but the distance W4 between the additional film 50 and the reflector 25 is adjusted to be equal to or less than λ/16 when the additional film 50 is separated from the reflector 25 as in the fourth variation of the first embodiment.

Figure 10:
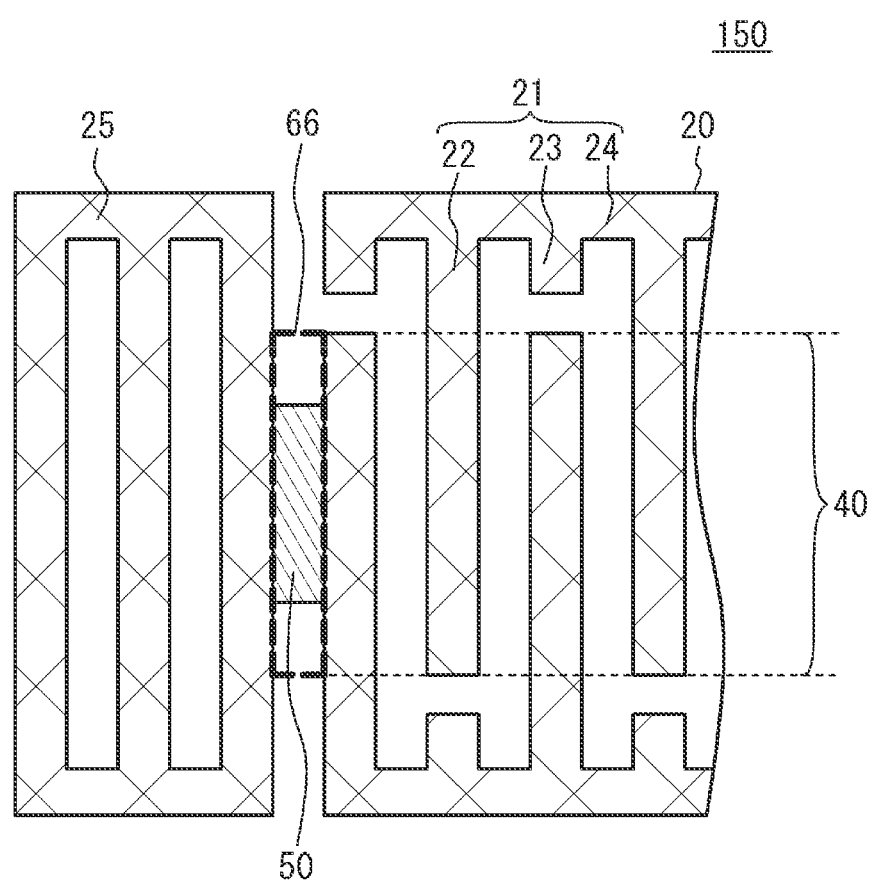
FIG. 10 is a plan view of an acoustic wave device in accordance with a fifth variation of the first embodiment.

FIG. 10 is a plan view of an acoustic wave device in accordance with a fifth variation of the first embodiment. FIG. 10 illustrates a part of the acoustic wave device. As illustrated in FIG. 10, in an acoustic wave device 150 in accordance with the fifth variation of the first embodiment, the additional film 50 is provided in a part of a region 66 that is located between the comb-shaped electrodes 21 and the reflector 25 and defined by the extended lines of the overlap region 40. The additional film 50 is provided in, for example, half or more of the region 66. Other configurations are the same as those of the first embodiment, and thus the description thereof will be omitted. To reduce spurious emissions, the additional film 50 is preferably provided in the entire region 66, but is only required to be provided in at least half or more of the region 66.

As described above, in the first embodiment and the variations thereof, the additional film 50 is provided on the piezoelectric body 18 between the comb-shaped electrodes 21 and each of the reflectors 25. The overlap width W1 of the additional film 50 with the comb-shaped electrodes 21 and the overlap width W2 of the additional film 50 with the reflector 25 are equal to or less than ⅛ of the average pitch of the electrode fingers 22 (λ/16 or less), and the distance W3 between the additional film 50 and the comb-shaped electrodes 21 and the distance W4 between the additional film 50 and the reflector 25 are equal to or less than ⅛ of the average pitch of the electrode fingers 22 (λ/16 or less). By providing such an additional film 50, the acoustic velocity of the lateral wave propagating through the region 60 between the comb-shaped electrodes 21 and the reflector 25 can be adjusted to be close to the acoustic velocity of the lateral wave propagating through each of the region 62 where the comb-shaped electrodes 21 are provided and the region 64 where the reflector 25 is provided, as illustrated in FIG. 4B, while reducing the influence of the additional film 50 on the comb-shaped electrodes 21 and the reflectors 25. Therefore, longitudinal-mode spurious emissions can be reduced. To reduce spurious emissions, the overlap widths W1 and W2 and the distances W3 and W4 are preferably equal to or less than 1/16 of the average pitch P ($\lambda$/32 or less), and more preferably zero. The zero is allowed to have a degree of manufacturing error.

In the first embodiment and the variations thereof, the additional film 50 is provided in half or more of the region that is located between the comb-shaped electrode 21 and the reflector 25 and defined by the extended lines of the overlap region 40. This configuration allows the acoustic velocity of the lateral wave propagating through half or more of the region 66 to be closer to the acoustic velocity of the lateral wave propagating through each of the regions 62 and 64, thereby, reducing longitudinal-mode spurious emissions. To reduce spurious emissions, the additional film 50 is preferably provided in 2/3 or more of the region 66, more preferably provided in 3/4 or more of the region 66, and further provided in the entire of the region 66.

In the first embodiment and the variations thereof, the product of the thickness H1 of the additional film 50 and the density $\rho$1 of the additional films 50, i.e., (H1×$\rho$1), is equal to or greater than 0.4 times and equal to or less than 1.6 times the product of the thickness H2 of the electrode finger 22, the duty ratio D of the electrode finger 22, and the density $\rho$2 of the electrode finger 22, i.e., (H2×D×$\rho$2), for example. This configuration can reduce longitudinal-mode spurious emissions. To reduce spurious emissions, the value of (H1×$\rho$1) is preferably equal to or greater than 0.5 times and equal to or less than 1.5 times the value of (H2×D×$\rho$2), more preferably equal to or greater than 0.6 times and equal to or less than 1.4 times the value of (H2×D×$\rho$2), and further preferably equal to or greater than 0.7 times and equal to or less than 1.3 times the value of (H2×D×$\rho$2).

In the first embodiment and the variations thereof, the acoustic velocity of the lateral wave propagating through the region 60 between the comb-shaped electrodes 21 and the reflector 25 is equal to or greater than 0.95 times and equal to or less than 1.05 times the acoustic velocity of the lateral wave propagating through the region 62 where the comb-shaped electrodes 21 are provided and the acoustic velocity of the lateral wave propagating through the region 64 where the reflector 25 is provided. This configuration can reduce longitudinal-mode spurious emissions. To reduce spurious emissions, the acoustic velocity of the lateral wave propagating through the region 60 is preferably equal to or greater than 0.97 times and equal to or less than 1.03 times the acoustic velocity of the lateral wave propagating through each of the regions 62 and 64, more preferably equal to or greater than 0.98 times and equal to or less than 1.02 times the acoustic velocity of the lateral wave propagating through each of the regions 62 and 64.

Figure 11:
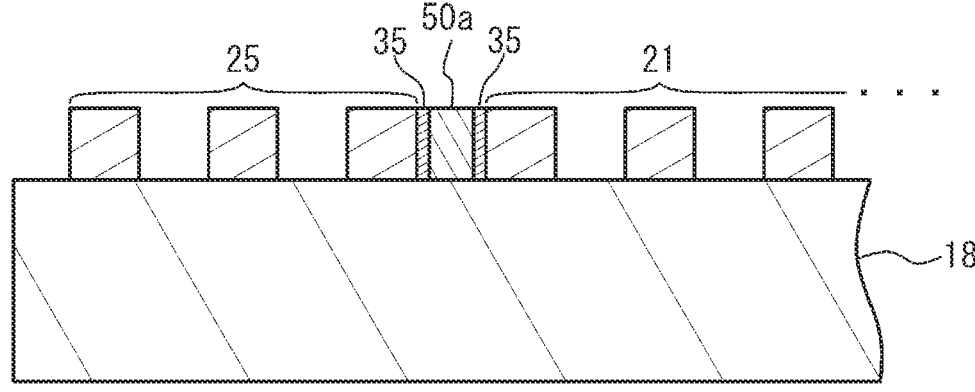
FIG. 11 is a cross-sectional view of the additional film when the additional film in the first embodiment is a metal film.

In the first embodiment and the variations thereof, the additional film 50 is a film containing tantalum oxide, niobium oxide, silicon oxide, or aluminum oxide as a main component. By using such an additional film 50, the acoustic velocity of the lateral wave propagating through the region 60 between the comb-shaped electrodes 21 and the reflector 25 can be easily adjusted to be close to the acoustic velocity of the lateral wave propagating through the region 62 where the comb-shaped electrodes 21 are provided and the acoustic velocity of the lateral wave propagating through the region 64 where the reflector 25 is provided. The additional film 50 may be formed of a metal film. FIG. 11 is a cross-sectional view of the case where the additional film in the first embodiment is a metal film. As illustrated in FIG. 11, when an additional film 50a made of a metal film such as a titanium film is provided, insulating films 35 are provided between the additional film 50a and the comb-shaped electrodes 21 and between the additional film 50a and the reflector 25.

In the first embodiment and the variations thereof, the case where the piezoelectric layer provided on the support substrate 10 is used as the piezoelectric body 18 is described, but this does not intend to suggest any limitation. The piezoelectric body may be a piezoelectric substrate without using the support substrate 10.

Second Embodiment

Figure 12A:
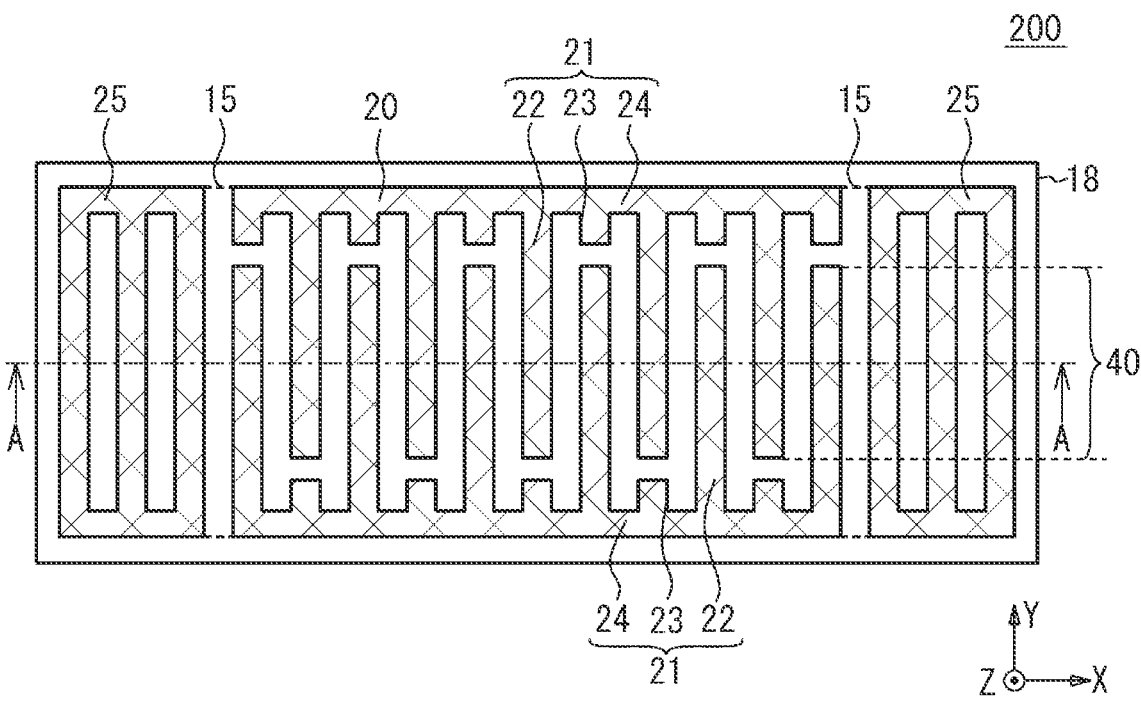
FIG. 12A is a plan view of an acoustic wave device in accordance with a second embodiment.
Figure 12B:
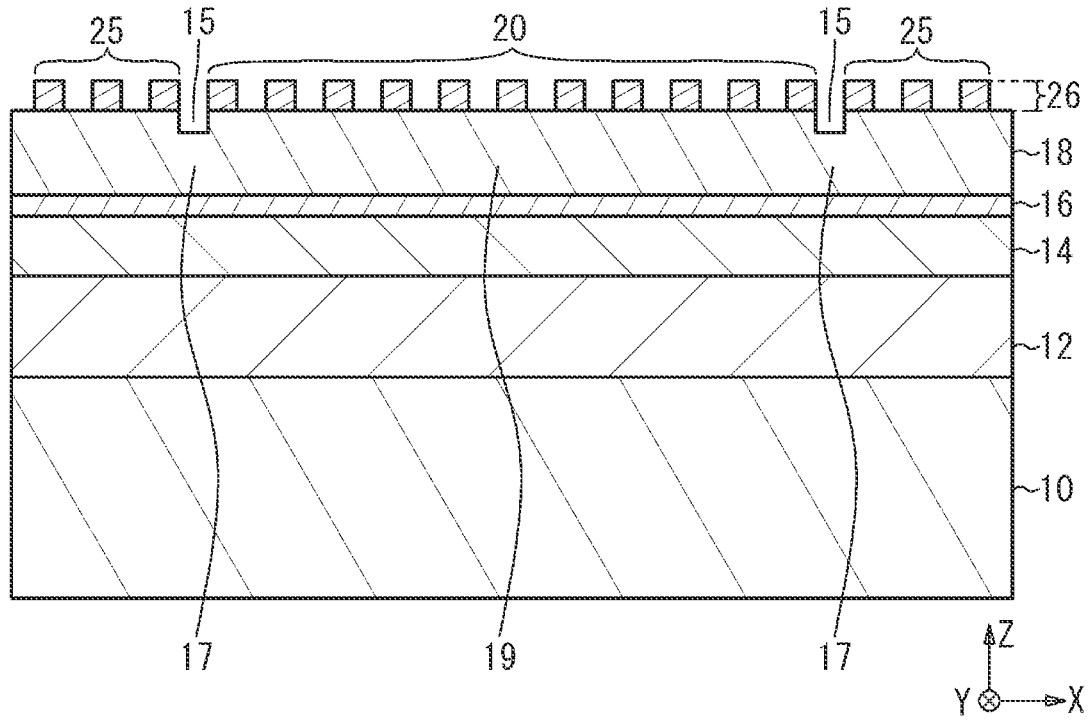
FIG. 12B is a cross-sectional view taken along line A-A in FIG. 12A.

FIG. 12A is a plan view of an acoustic wave device in accordance with a second embodiment, and FIG. 12B is a cross-sectional view taken along line A-A in FIG. 12A. As illustrated in FIG. 12A and FIG. 12B, in an acoustic wave device 200 in accordance with the second embodiment, no additional film is provided between the IDT 20 and each of the reflectors 25. Instead, a recess 15 is provided in the piezoelectric body 18 between the IDT 20 and each of the reflectors 25. In the piezoelectric body 18, the section where the recess 15 is provided is a thin film section 17 and other sections are thick film sections 19 thicker than the thin film section 17. Therefore, the IDT 20 and the reflectors 25 are provided in the thick film sections 19 of the piezoelectric body 18, and the piezoelectric body 18 between the IDT 20 and the reflector 25 is the thin film section 17. That is, the IDT 20 and the reflectors 25 are provided in the thick film sections 19 of the piezoelectric body 18 with the thin film sections 17 of the piezoelectric body 18 interposed therebetween. Other configurations are the same as those of the first embodiment, and thus the description thereof will be omitted.

Simulation

Simulations for evaluating the acoustic velocity were performed on models 4 and 5 in which the thickness of the piezoelectric body 18 was varied. The models 4 and 5 have the same structure as the models 1 to 3 illustrated in FIG. 6A and FIG. 6B. The simulation conditions are as follows.

Common Conditions

Support substrate 10: Sapphire substrate

Insulating film 12: Aluminum oxide film with a thickness of 6000 nm

Temperature compensation film 14: Silicon oxide film with a thickness of 440 nm Piezoelectric body 18: Lithium tantalate film with a thickness of 0.1$\lambda$ or 0.5$\lambda$ IDT 20, reflector 25: Multilayer film including a titanium film with a thickness of 10 nm and an aluminum film with a thickness of 135 nm Number of pairs in IDT 20: 150 pairs Number of pairs in reflector 25: 20

Duty ratio of electrode finger 22: 50%

Length of dummy electrode finger 23 in Y direction: 1.5$\lambda$

Aperture length L: 15$\lambda$

Distance I between IDT 20 and reflector 25: 24

Difference in acoustic velocity of lateral wave among regions 60, 62, 64: Present Conditions of Model 4

Wavelength $\lambda$ of acoustic wave: 1.5 $\mu$m

Conditions of Model 5

Wavelength $\lambda$ of acoustic wave: 2.2 $\mu$m

Figure 13A:
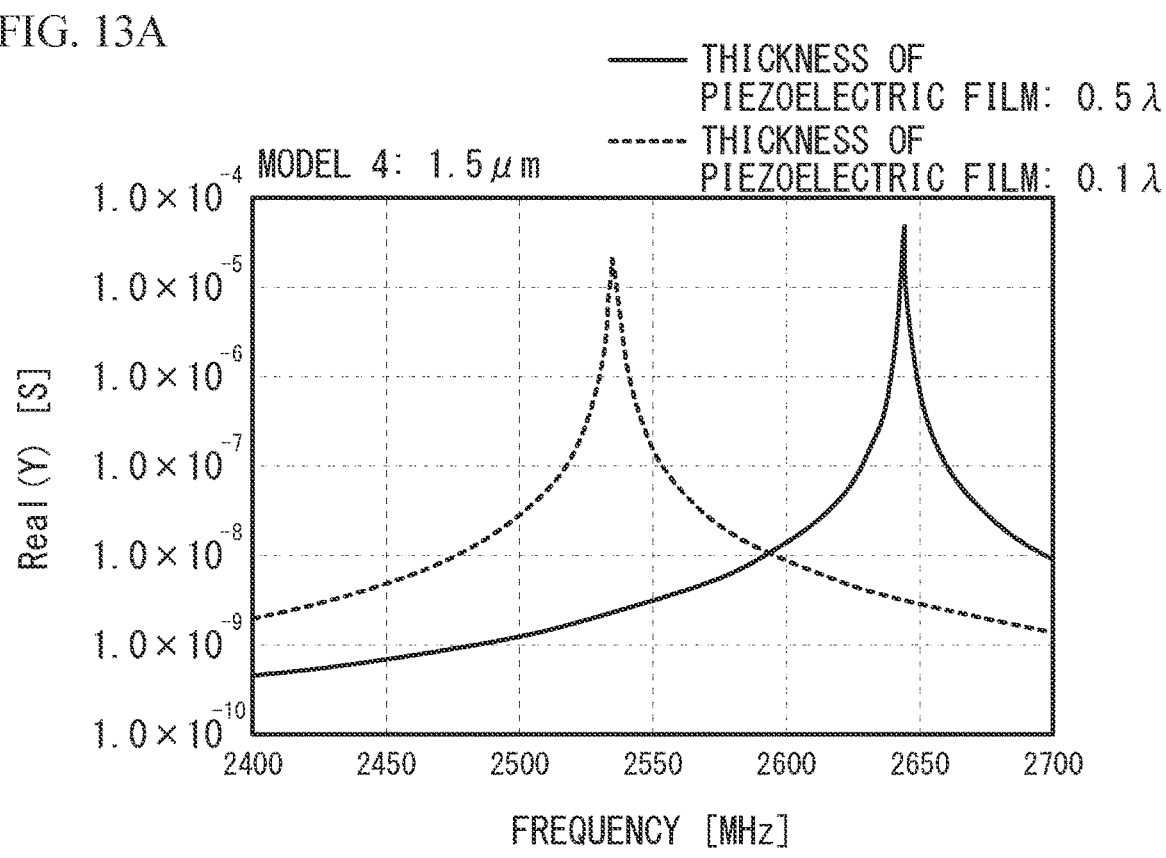
FIG. 13A and FIG. 13B present simulation results of the real part Real (Y) of the admittance with respect to frequency.
Figure 13B:
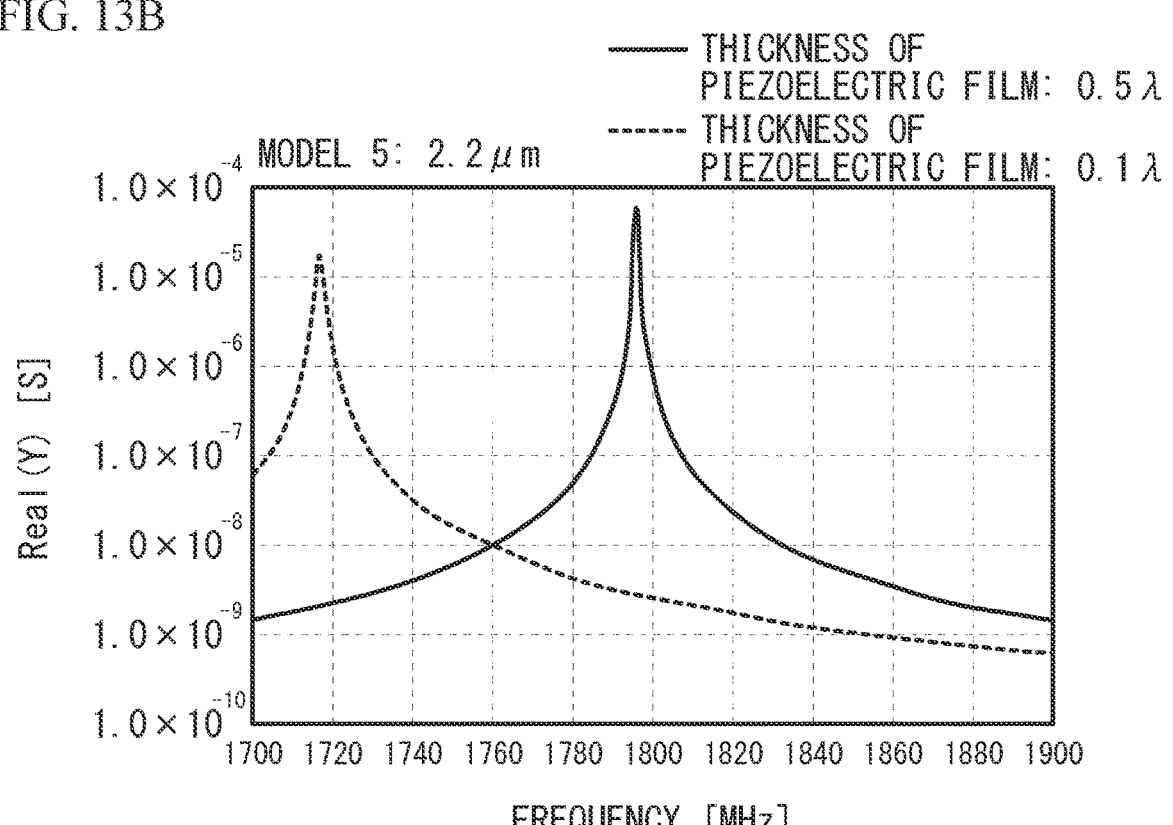

FIG. 13A and FIG. 13B present simulation results of the real part Real (Y) of the admittance with respect to frequency for the models 4 and 5, respectively. In FIG. 13A and FIG. 13B, the horizontal axis represents the frequency [MHz], and the vertical axis represents the real part Real(Y) [S] of the admittance. As illustrated in FIG. 13A, in the case that the acoustic wave has a wave length λ of 1.5 μm, the acoustic velocity of the lateral wave at the resonant frequency is 3802 m/s when the piezoelectric body 18 has a thickness of 0.12, and the acoustic velocity of the lateral wave at the resonant frequency is 3966 m/s when the piezoelectric body 18 has a thickness of 0.52. As illustrated in FIG. 13B, in the case that the acoustic wave has a wave length λ of 2.2 μm, the acoustic velocity of the lateral wave at the resonant frequency is 3777 m/s when the piezoelectric body 18 has a thickness of 0.12, and the acoustic velocity of the lateral wave at the resonant frequency is 3891 m/s when the piezoelectric body 18 has a thickness of 0.5λ. Thus, as the piezoelectric body 18 becomes thinner, the acoustic velocity of the lateral wave becomes lower.

Therefore, in the second embodiment, since the piezoelectric body 18 between the comb-shaped electrodes 21 and the reflector 25 is thin, the acoustic velocity of the lateral wave propagating through the region between the comb-shaped electrodes 21 and the reflector 25 is reduced. Therefore, the acoustic velocity of the lateral wave propagating through the region between the comb-shaped electrodes 21 and the reflector 25 can be made close to the acoustic velocity of the lateral wave propagating through the region where the comb-shaped electrodes 21 are provided and the acoustic velocity of the lateral wave propagating through the region where the reflector is provided.

In the second embodiment, the comb-shaped electrodes 21 and the reflectors 25 are provided in the thick film sections 19 (first section) of the piezoelectric body 18, and the piezoelectric body 18 between the comb-shaped electrodes 21 and each of the reflectors 25 is the thin film section 17 (second section) thinner than the thick film section 19. This allows the acoustic velocity of the lateral wave propagating through the region between the comb-shaped electrodes 21 and the reflector 25 to be close to the acoustic velocity of the lateral wave propagating through the region where the comb-shaped electrodes 21 are provided and the acoustic velocity of the lateral wave propagating through the region where the reflector 25 is provided. Therefore, the longitudinal-mode spurious emissions can be reduced.

In the second embodiment, the thickness of the thick film section 19 of the piezoelectric body 18 is preferably equal to or less than two times the average pitch P of the electrode fingers 22 (equal to or less than 2). The acoustic velocity of the lateral wave can be easily reduced by forming the thin film section 17 in the piezoelectric body 18.

In the second embodiment, the case where the recess 15 is provided on the upper surface of the piezoelectric body 18 is described as an example, but the recess 15 may be provided on the lower surface of the piezoelectric body 18.

Third Embodiment

Figure 14:
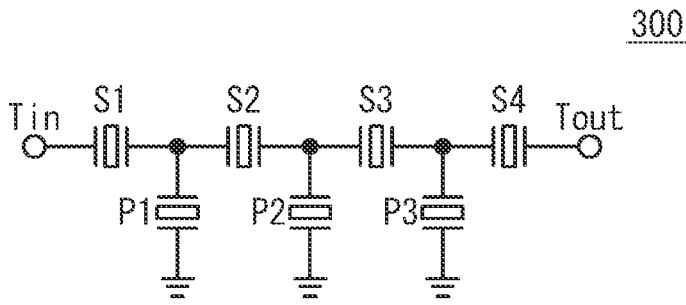
FIG. 14 is a circuit diagram of a filter in accordance with a third embodiment.

FIG. 14 is a circuit diagram of a filter in accordance with a third embodiment. As illustrated in FIG. 14, in a filter 300 according to the third embodiment, one or more series resonators S1 to S4 are connected in series between an input terminal Tin and an output terminal Tout. One or more parallel resonators P1 to P3 are connected in parallel between the input terminal Tin and the output terminal Tout. Any one of the acoustic wave devices of the first embodiment, the variations of the first embodiment, and the second embodiment may be used for at least one of the following resonators: the series resonators S1 to S4 and the parallel resonators P1 to P3. The number of series resonators and parallel resonators can be set as appropriate. Although the ladder-type filter is described as an example of the filter, the filter may be a multimode filter.

Fourth Embodiment

Figure 15:
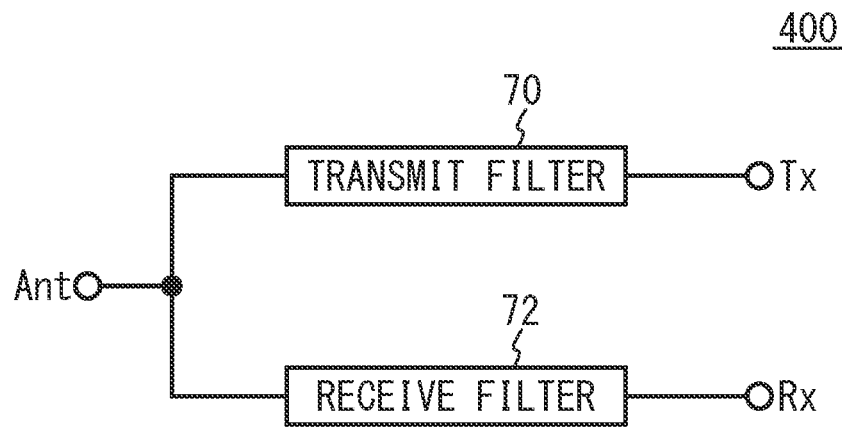
FIG. 15 is a circuit diagram of a duplexer in accordance with a fourth embodiment.

FIG. 15 is a circuit diagram of a duplexer in accordance with a fourth embodiment. As illustrated in FIG. 15, in a duplexer 400 in accordance with the fourth embodiment, a transmit filter 70 is connected between a common terminal Ant and a transmit terminal Tx. A receive filter 72 is connected between the common terminal Ant and a receive terminal Rx. The transmit filter 70 transmits signals in the transmit band to the common terminal Ant as transmit signals among high-frequency signals input from the transmit terminal Tx, and suppresses signals with other frequencies. The receive filter 72 transmits signals in the receive band to the receive terminal Rx as reception signals among high-frequency signals input from the common terminal Ant, and suppresses signals with other frequencies. At least one of the transmit filter 70 or the receive filter 72 may be the filter of the third embodiment. Although the duplexer is described as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. An acoustic wave device comprising:
a piezoelectric body;
a pair of comb-shaped electrodes provided on the piezoelectric body, the pair of comb-shaped electrodes including a plurality of electrode fingers;
a reflector provided on the piezoelectric body so as to be arranged in line with the pair of comb-shaped electrodes in an arrangement direction of the plurality of electrode fingers; and
an additional film provided on the piezoelectric body between the pair of comb-shaped electrodes and the reflector so that an overlap width with the pair of comb-shaped electrodes and an overlap width with the reflector are equal to or less than ⅛ of an average pitch of the plurality of electrode fingers of the pair of comb-shaped electrodes and a distance between the additional film and the pair of comb-shaped electrodes and a distance between the additional film and the reflector are equal to or less than ⅛ of the average pitch,
wherein the additional film is an insulating film, and
wherein the additional film is not provided between the plurality of electrode fingers.

2. The acoustic wave device according to claim 1, wherein the additional film is provided in a region that is half or more of a region that is located between the pair of comb-shaped electrodes and the reflector and defined by extended lines of an overlap region where the plurality of electrode fingers of the pair of comb-shaped electrodes overlap.

3. An acoustic wave device comprising:
a piezoelectric body;
a pair of comb-shaped electrodes provided on the piezoelectric body, the pair of comb-shaped electrodes including a plurality of electrode fingers;

a reflector provided on the piezoelectric body so as to be arranged in line with the pair of comb-shaped electrodes in an arrangement direction of the plurality of electrode fingers; and an additional film that is provided on the piezoelectric body between the pair of comb-shaped electrodes and the reflector so that an overlap width with the pair of comb-shaped electrodes and an overlap width with the reflector are equal to or less than ⅛ of an average pitch of the plurality of electrode fingers of the pair of comb-shaped electrodes and a distance between the additional film and the pair of comb-shaped electrodes and a distance between the additional film and the reflector are equal to or less than ⅛ of the average pitch, wherein a value obtained by multiplying a thickness of the additional film by a density of the additional film is equal to or greater than 0.4 times and equal to or less than 1.6 times a value obtained by multiplying the thickness of the plurality of electrode fingers by a duty ratio of the plurality of electrode fingers and a density of the plurality of electrode fingers.

4. The acoustic wave device according to claim 1, wherein the additional film is a film containing tantalum oxide, niobium oxide, silicon oxide, or aluminum oxide as a main component.

5. The acoustic wave device according to claim 1, wherein the acoustic velocity of the lateral wave propagating through the region between the pair of comb-shaped electrodes and the reflector is equal to or greater than 0.95 times and equal to or less than 1.05 times the acoustic velocity of the lateral wave propagating through the region where the pair of comb-shaped electrodes are provided.

6. An acoustic wave device comprising:

a piezoelectric body including a first section having a first thickness and a second section having a second thickness less than the first thickness;

a pair of comb-shaped electrodes provided on the piezoelectric body, the pair of comb-shaped electrodes including a plurality of electrode fingers; and a reflector provided on the piezoelectric body, the reflector being provided in line with the pair of comb-shaped electrodes in an arrangement direction of the plurality of electrode fingers, wherein the pair of comb-shaped electrodes and the reflector are provided in the first section of the piezoelectric body, and wherein a section of the piezoelectric body between the pair of comb-shaped electrodes and the reflector is the second section.

7. The acoustic wave device according to claim 6, wherein a thickness of the piezoelectric body in the first section is equal to or less than two times an average pitch of the plurality of electrode fingers of the pair of comb-shaped electrodes.

8. A filter comprising the acoustic wave device according to claim 1.

9. A filter comprising the acoustic wave device according to claim 6.

10. A multiplexer comprising the filter according to claim 8.

11. A multiplexer comprising the filter according to claim 9.

* * * * *